(12) United States Patent
Nagasawa et al.

(10) Patent No.: US 11,374,082 B2
(45) Date of Patent: Jun. 28, 2022

(54) ELECTRONIC DEVICE AND METHOD OF MANUFACTURING ELECTRONIC DEVICE, AND ELECTRONIC APPARATUS

(71) Applicant: Sony Group Corporation, Tokyo (JP)

(72) Inventors: Koichi Nagasawa, Kanagawa (JP); Hirofumi Fujioka, Kanagawa (JP); Tomoaki Honda, Aichi (JP)

(73) Assignee: Sony Group Corporation, Tokyo (JP)

( * ) Notice: Subject to any disclaimer, the term of this patent is extended or adjusted under 35 U.S.C. 154(b) by 0 days.

(21) Appl. No.: 16/565,927

(22) Filed: Sep. 10, 2019

(65) Prior Publication Data

US 2020/0006459 A1 Jan. 2, 2020

Related U.S. Application Data

(63) Continuation of application No. 15/321,343, filed as application No. PCT/JP2015/068136 on Jun. 15, 2015, now abandoned.

(30) Foreign Application Priority Data

Jul. 17, 2014 (JP) ................................. 2014-146855

(51) Int. Cl.
  *H01L 27/32* (2006.01)
  *H05B 33/26* (2006.01)
  (Continued)

(52) U.S. Cl.
  CPC ...... *H01L 27/3276* (2013.01); *H01L 27/3258* (2013.01); *H01L 27/3262* (2013.01); *H01L 51/0031* (2013.01); *H01L 51/5253* (2013.01); *H05B 33/26* (2013.01); *H01L 27/1244* (2013.01); *H01L 2227/323* (2013.01); (Continued)

(58) Field of Classification Search
  CPC ............. H01L 27/3276; H01L 27/3258; H01L 27/3262; H01L 27/1244
  See application file for complete search history.

(56) References Cited

U.S. PATENT DOCUMENTS 5,055,907 A 10/1991 Jacobs
6,559,548 B1 5/2003 Matsunaga et al.
(Continued)

FOREIGN PATENT DOCUMENTS

CN 1581472 A 2/2005
JP 02-051255 A 2/1990
(Continued)

OTHER PUBLICATIONS

Wang, L., Yoon, MH., Lu, G. et al. High-performance transparent inorganic-organic hybrid thin-film n-type transistors. Nature Mater 5, 893-900 (2006) (Year: 2006).*

(Continued)

*Primary Examiner* — Mark W Tornow
(74) *Attorney, Agent, or Firm* — Michael Best & Friedrich LLP

(57) ABSTRACT

An electronic device of the technology includes: a plurality of first wiring patterns that are electrically coupled to each other partially, and each extend in a first direction; an organic insulating layer that is provided on the first wiring patterns; and a second wiring pattern that is provided on the organic insulating layer.

19 Claims, 10 Drawing Sheets

(51) Int. Cl.
*H01L 51/52* (2006.01)
*H01L 51/00* (2006.01)
*H05B 33/22* (2006.01)
*H01L 27/12* (2006.01)

(52) U.S. Cl.
CPC .......... *H01L 2251/5392* (2013.01); *H01L 2251/568* (2013.01); *H01L 2924/0002* (2013.01); *H05B 33/22* (2013.01)

(56) References Cited

U.S. PATENT DOCUMENTS

| | | | |
|---|---|---|---|
| 6,707,156 B2 | 3/2004 | Suzuki et al. | |
| 7,932,606 B2 | 4/2011 | Hotta et al. | |
| 2008/0198102 A1* | 8/2008 | Yamashita | G09G 3/3233 345/76 |
| 2008/0313893 A1* | 12/2008 | Nakasu | H01L 27/124 29/830 |
| 2014/0209914 A1 | 7/2014 | Nagasawa et al. | |
| 2016/0336386 A1* | 11/2016 | Saito | H01L 23/53238 |

FOREIGN PATENT DOCUMENTS

| | | |
|---|---|---|
| JP | 04-042934 A | 2/1992 |
| JP | 11-282010 | 10/1999 |
| JP | 2004-221559 A | 8/2004 |
| JP | 2004-342457 A | 12/2004 |
| JP | 2005-072573 A | 3/2005 |
| JP | 2007-027503 A | 2/2007 |
| JP | 2012-054510 A | 3/2012 |

OTHER PUBLICATIONS

Chinese Office Action dated Jun. 11, 2019 for corresponding Chinese Application No. 2015800386584.

* cited by examiner

[ FIG. 1 ]
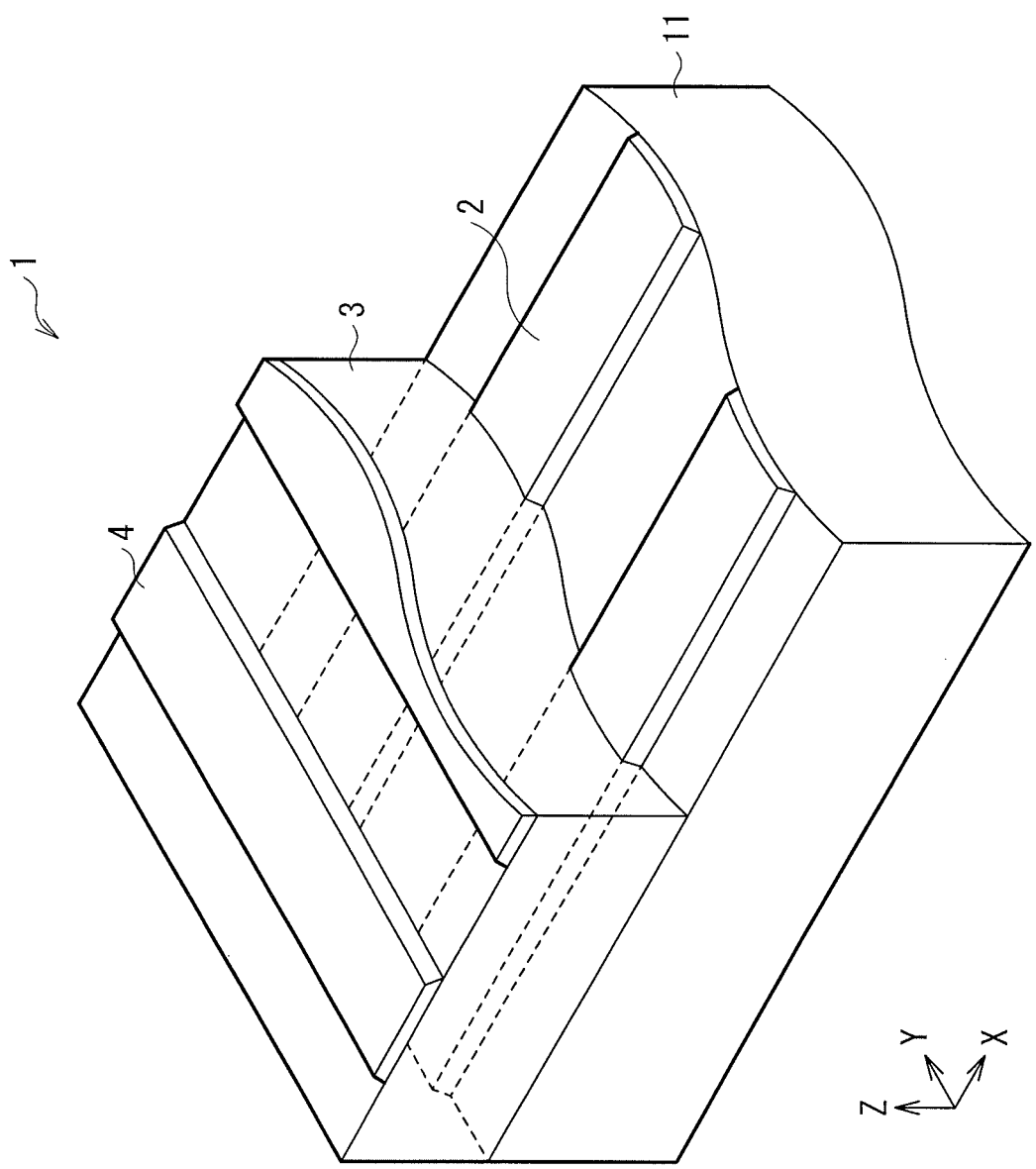

[FIG. 2]
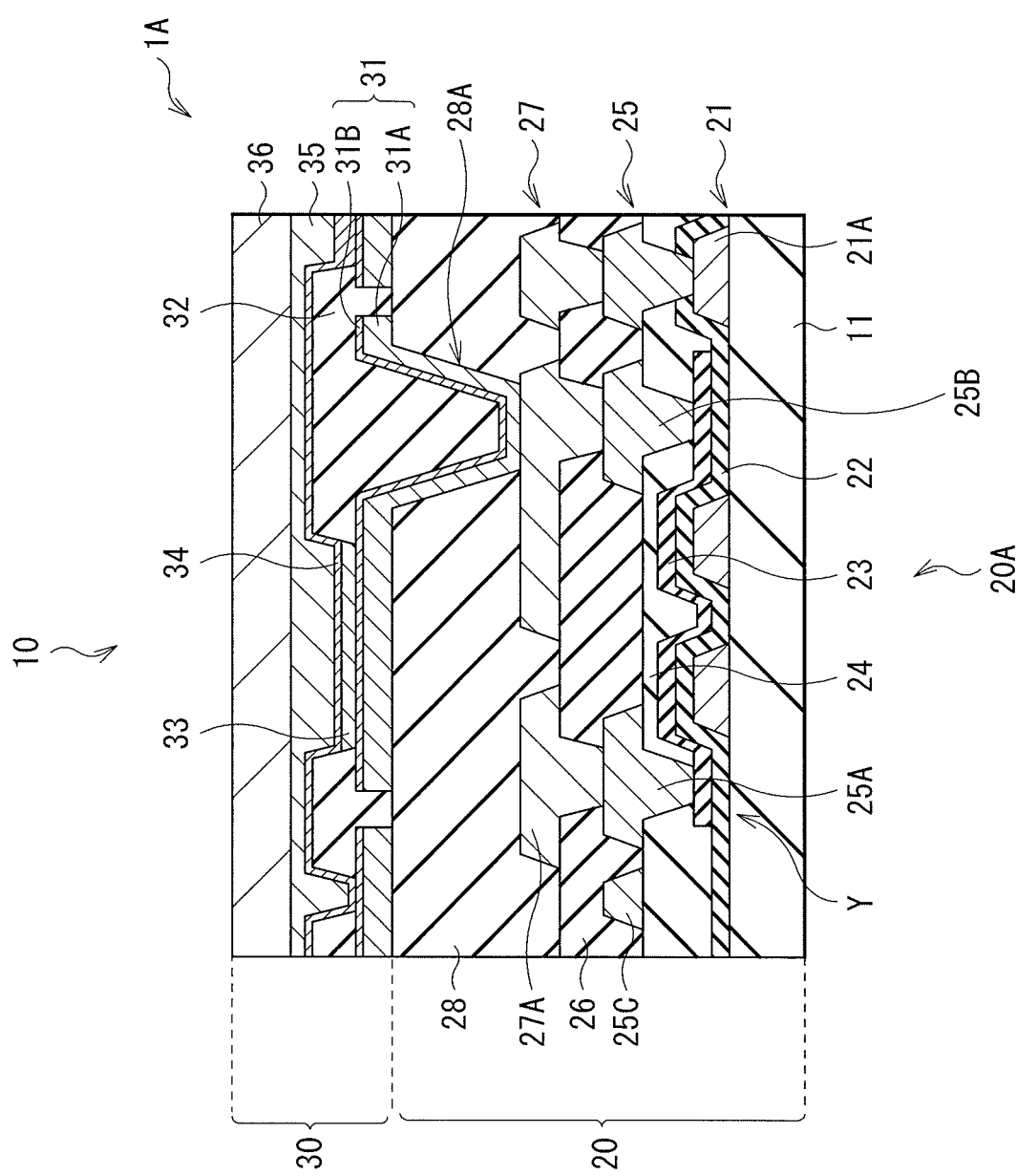

[ FIG. 3 ]
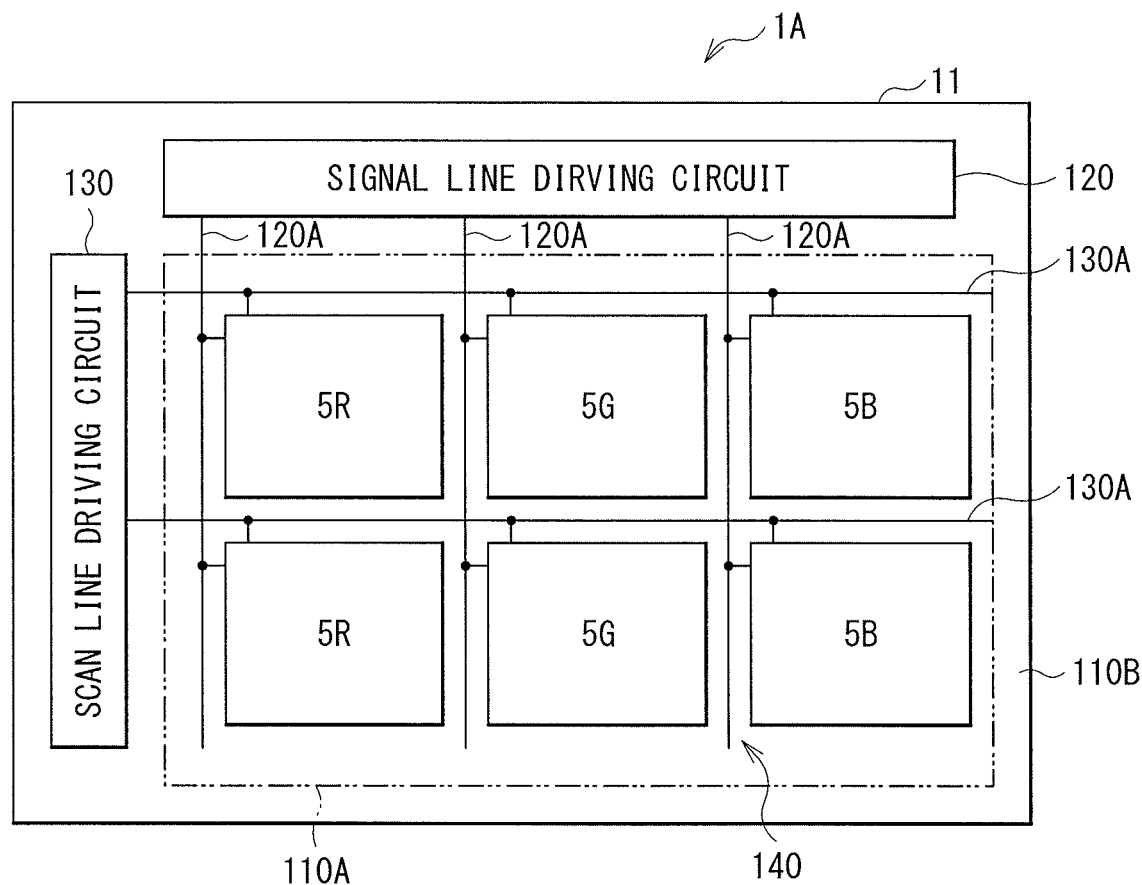
[ FIG. 4 ]
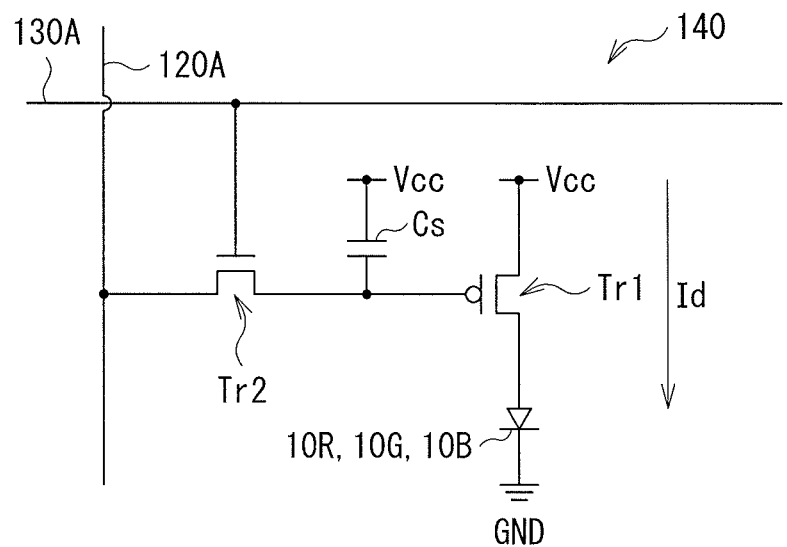

[ FIG. 5 ]
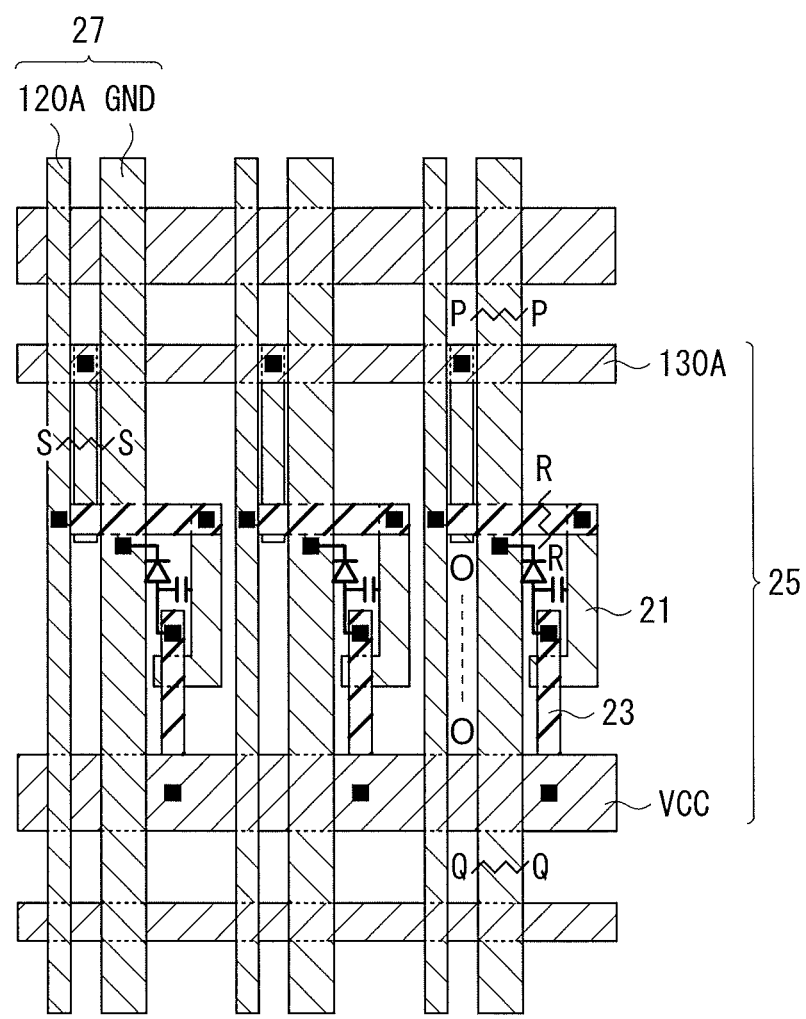

[ FIG. 6 ]
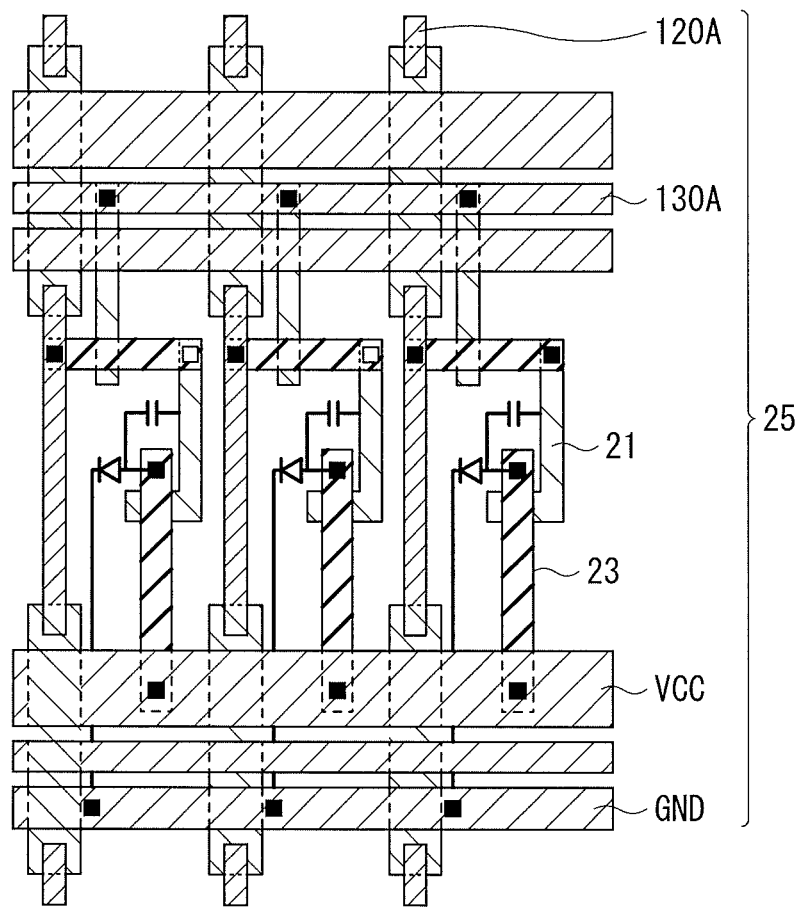

[ FIG. 7 ]
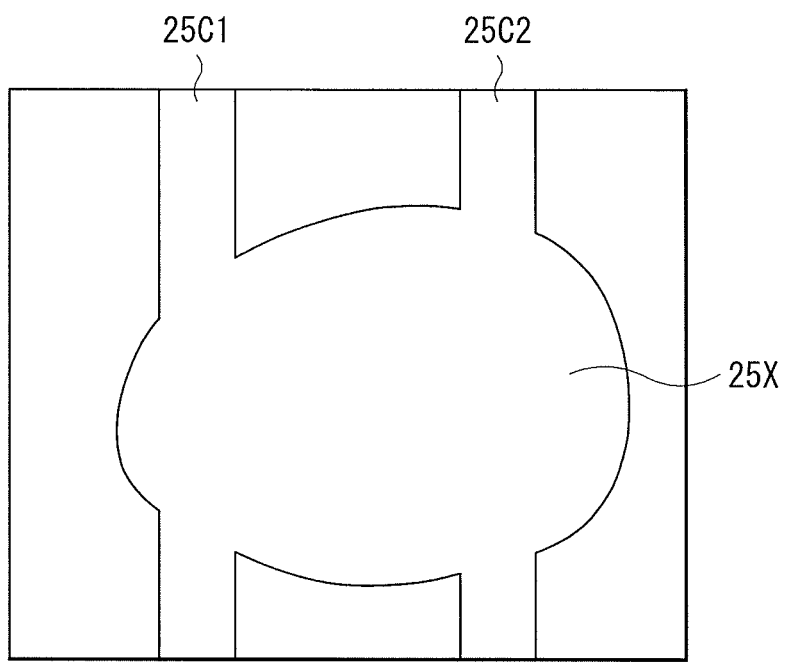

[ FIG. 8 ]
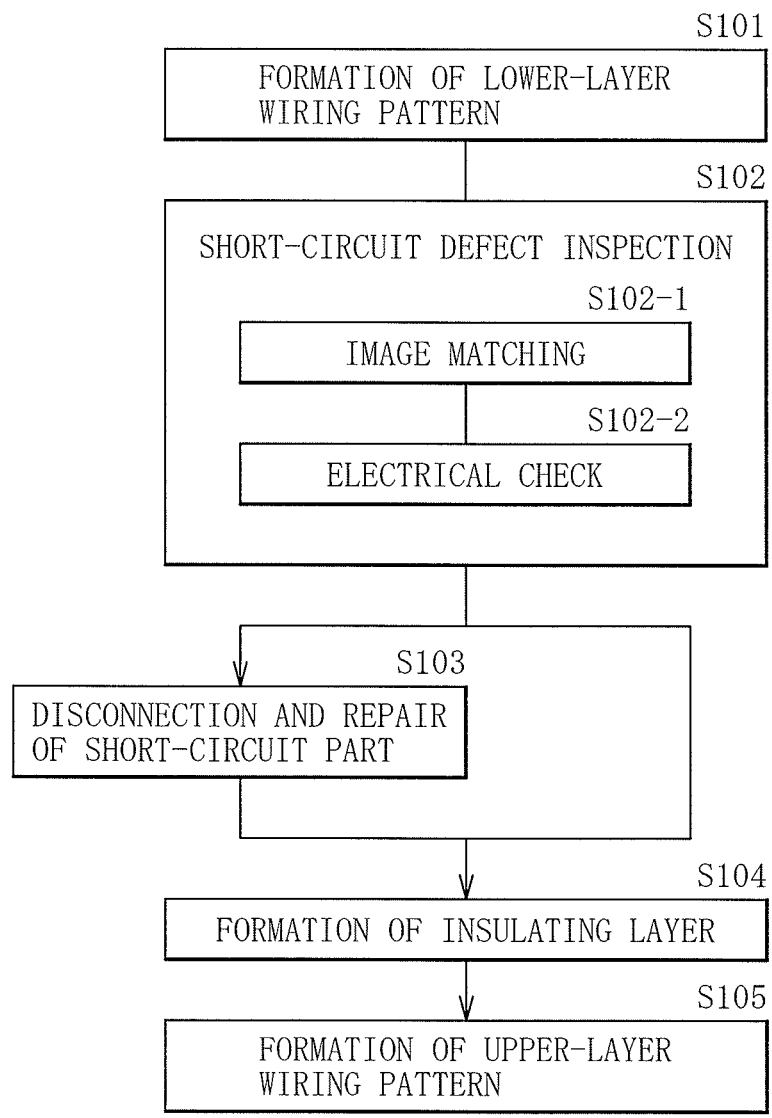

[ FIG. 9 ]
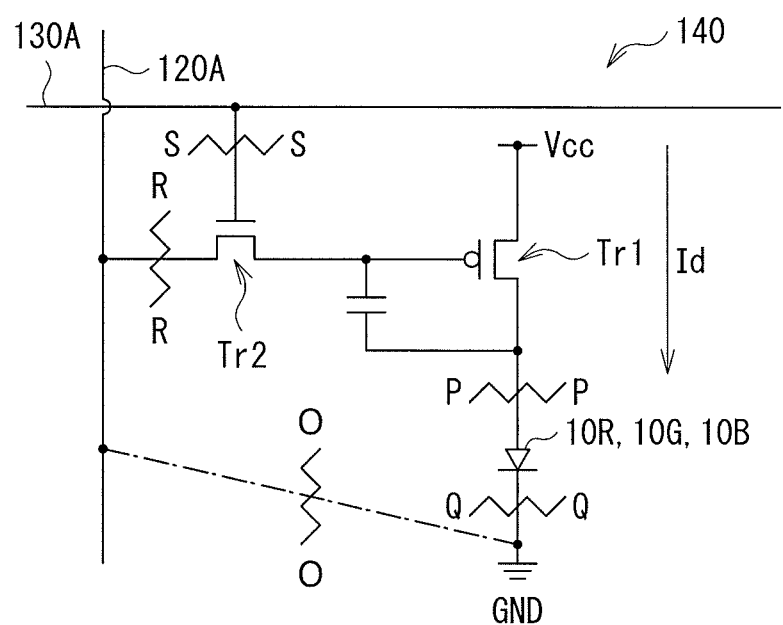

[ FIG. 10A ]
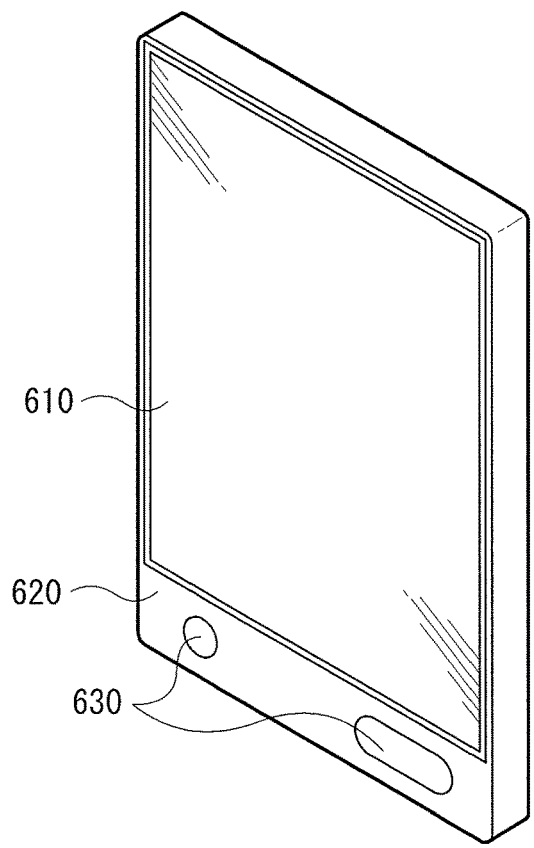
[ FIG. 10B ]
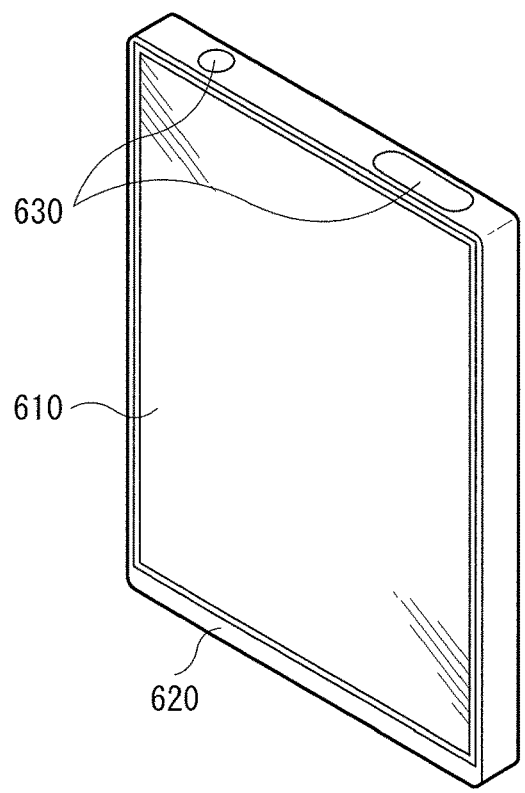

[ FIG. 11 ]
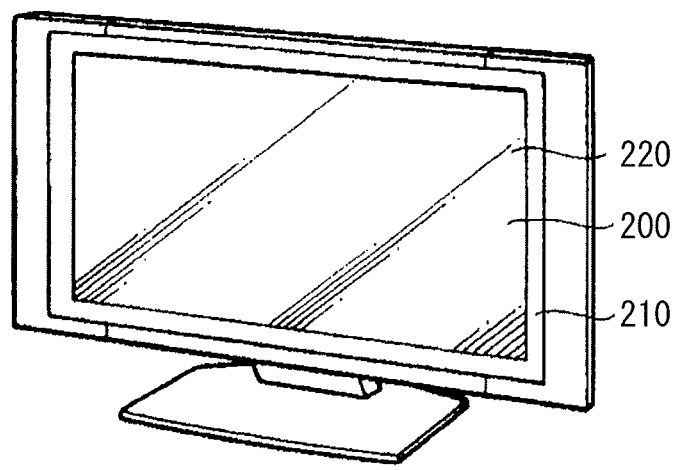
[ FIG. 12 ]
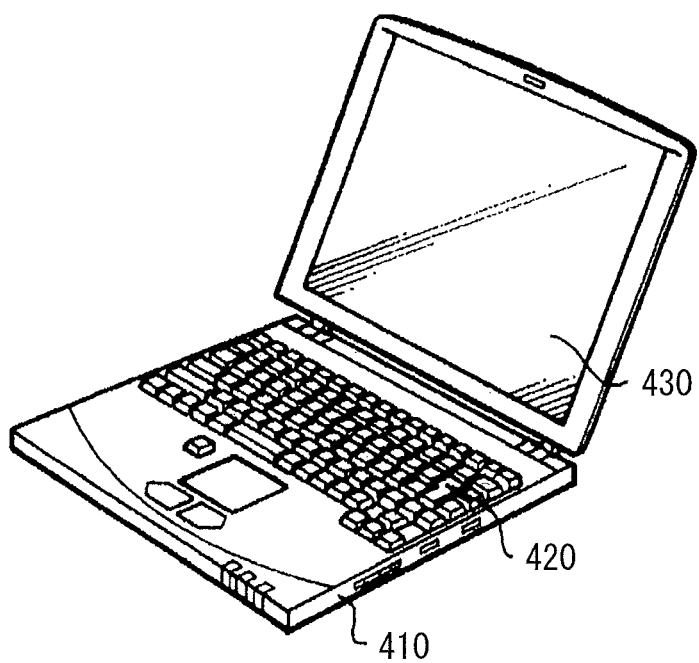

ELECTRONIC DEVICE AND METHOD OF MANUFACTURING ELECTRONIC DEVICE, AND ELECTRONIC APPARATUS

CROSS REFERENCE TO RELATED APPLICATIONS

This is a Continuation Application of U.S. patent application Ser. No. 15/321,343, filed Dec. 22, 2016, which is a National Stage Entry of Application No.: PCT/JP2015/067136, filed Jun. 15, 2015, which claims priority to Japanese Patent Application No.: 2014-146855, filed Jul. 17, 2014, the entire contents of which being incorporated herein by reference.

TECHNICAL FIELD

The technology relates to an electronic device having a structure in which a plurality of wiring patterns are laminated with an organic insulating layer interposed between, to a method of manufacturing such an electronic device, and to an electronic apparatus that includes such an electronic device.

BACKGROUND ART

In recent years, in an electronic device, the number of wiring patterns has been increased to improve the performance thereof, and circuits have become complex accordingly. In particular, in a display device used for an organic EL (Electroluminescence) display unit or any other display unit, circuits thereof have become more complex due to a large number of thin-film transistors (TFTs) and wiring circuits as well as an increase in the area of a capacitor, or any other reason.

Moreover, in the organic EL display unit, a further increase in size of a display region and higher definition have been desired. When the display region is made larger in size, signal delay may occur due to a load attributed to a wiring resistance and a parasitic capacitance. Further, when higher definition is achieved, wiring layers to form wiring patterns such as a wiring pattern or signal lines for driving have been increased in density as a result of an increase in the number of pixels, which has caused an increase in the number of short-circuit defects, resulting in reduction in the manufacturing yield.

To solve such an issue, for example, PTL 1 discloses a method of improving the manufacturing yield in a manner of separating a line defect that is a serious defect for a display unit or a defect part that causes a bright spot from wiring patterns using a laser beam to correct such defects or convert the bright spot into a dark spot. Further, for example, PTL 2 resolves an increase in density of wiring layers by achieving a multi-layered configuration of the wiring layers intended to form various wiring patterns, as well as by forming an insulating layer made of organic resin having low dielectric constant, or any other material between the wiring layers to avoid signal delay caused by the multi-layered configuration. What is more, PTL 2 discloses a method of disconnecting and repairing a short-circuit part of multi-layered wiring patterns by disconnecting wiring patterns on a lower layer without destroying an organic resin layer with use of a laser beam having transparency with respect to organic resin.

CITATION LIST

Patent Literature

[PTL 1] Japanese Unexamined Patent Application Publication No. 2004-342457
[PTL 2] Japanese Unexamined Patent Application Publication No. 2012-54510

SUMMARY OF THE INVENTION

However, in the method mentioned in PTL 2, although superior insulating property has been achieved in disconnecting and repairing a short-circuit part in wiring patterns that are provided on an upper layer of the organic resin layer (on the organic resin layer), it has been difficult to achieve the intended insulating property for wiring patterns that are provided in a lower layer of the organic resin layer.

Accordingly, it is desirable to provide an electronic device and a manufacturing method thereof, as well as an electronic apparatus that allow to achieve both of high quality and high manufacturing yield.

An electronic device according to an embodiment of the technology includes: a plurality of first wiring patterns that are electrically coupled to each other partially, and each extend in a first direction; an organic insulating layer provided on the first wiring patterns; and a second wiring pattern provided on the organic insulating layer.

A method of manufacturing an electronic device according to an embodiment of the technology includes the following processes (A) to (C).
(A) Forming a plurality of first wiring patterns that are electrically coupled to each other partially, and each extend in a first direction.
(B) Forming an organic insulating layer on the first wiring patterns.
(C) Forming a second wiring pattern on the organic insulating layer.

An electronic apparatus according to an embodiment of the technology includes the above-described electronic device according to the technology.

In the electronic device and the manufacturing method thereof, as well as the electronic apparatus of the technology, the plurality of first wiring patterns on which the organic insulating layer and the second wiring pattern are provided in this order in an upper layer thereof are disposed to be electrically coupled to each other partially, and to each extend in the first direction. This makes it possible to perform a short-circuit defect inspection, as well as disconnecting and repair of a detected short-circuit defect at the stage where the first wiring patterns are already formed.

According to the electronic device and the manufacturing method thereof, as well as the electronic apparatus of the respective embodiments of the technology, in the plurality of first wiring patterns and the second wiring pattern that are laminated with the organic insulating layer interposed between, the plurality of first wiring patterns that are provided in a lower layer of the organic insulating layer are disposed to be electrically coupled to each other partially, and to each extend in the first direction. This makes it possible to inspect the presence or absence of a short-circuit defect in the first wiring patterns, as well as to disconnect and repair a detected short-circuit defect at the stage where the first wiring patterns are already disposed. This makes it possible to provide the electronic device achieving both of the quality and the manufacturing yield, and the electronic apparatus that includes such an electronic device. It is to be noted that effects of the embodiments of the technology are not necessarily limited to the effects described above, and may include any of effects that will be described in the disclosure.

BRIEF DESCRIPTION OF DRAWINGS

FIG. 1 is an exploded perspective view of an electronic device according to an embodiment of the disclosure.

FIG. 2 is a cross-sectional view of a configuration of a display unit that includes a display device that is an example of the electronic device illustrated in FIG. 1.

FIG. 3 is a diagram illustrating an overall configuration of the display unit illustrated in FIG. 2.

FIG. 4 is a diagram illustrating an example of a pixel driving circuit illustrated in FIG. 3.

FIG. 5 is a diagram illustrating an example of wiring layout of the display unit illustrated in FIG. 2.

FIG. 6 is a diagram illustrating another example of the wiring layout of the display unit illustrated in FIG. 2.

FIG. 7 is a schematic diagram for explaining a short-circuit part.

FIG. 8 is a flowchart illustrating a process sequence for part of a method of manufacturing the electronic device illustrated in FIG. 1.

FIG. 9 is a diagram illustrating a location where it is possible to disconnect and repair a short-circuit part in the pixel driving circuit of the display unit illustrated in FIG. 2.

FIG. 10A is a perspective view illustrating external appearance viewed from front side of an application example 1 of a display unit using pixels of the above-described embodiments and the like.

FIG. 10B is a perspective view illustrating external appearance viewed from rear side of the application example 1 of the display unit using pixels of the above-described embodiments and the like.

FIG. 11 is a perspective view of external appearance of an application example 2.

FIG. 12 is a perspective view of external appearance of an application example 3.

MODES FOR CARRYING OUT THE INVENTION

Hereinafter, some embodiments of the disclosure will be described in detail with reference to the drawings. It is to be noted that the description will be given in the following order.
1. Embodiment (an example where a plurality of lower-layer wiring patterns are disposed in parallel in an electronic device provided with multi-layered wiring patterns)
1-1. Overall Configuration of Electronic Device (Display Unit)
1-2. Manufacturing Method
1-3. Workings and Effects
2. Application Examples (examples of electronic apparatuses each provided with the electronic device)

1. EMBODIMENT (1-1. Overall Configuration)

FIG. 1 illustrates a perspective view of a cross-sectional configuration of an electronic device (an electronic device 1) according to an embodiment of the disclosure. In the electronic device, a lower-layer wiring pattern 2 (a first wiring pattern) and an upper-layer wiring pattern 4 (a second wiring pattern) are laminated with an organic insulating layer 3 interposed between. The plurality of lower-layer wiring patterns 2 are provided on a substrate 11. The lower-layer wiring patterns 2 are disposed in such a manner that the lower-layer wiring patterns 2 are electrically coupled to each other partially, and each extend in one direction, for example, X-axis direction (a first direction). FIG. 2 illustrates a cross-sectional configuration of a display unit (a display unit 1A) that includes a display device that is an example of the electronic device 1 illustrated in FIG. 1. The display unit 1A may be used as, for example, an organic EL television apparatus or any other apparatus, and is provided with a display region 110A on the substrate 11 as illustrated in FIG. 3. Inside the display region 110A, a plurality of pixels (red pixels 5R, green pixels 5G, and blue pixels 5B) are arrayed in a matrix pattern. Further, at a peripheral region 110B located at the periphery (outer edge side or outer circumferential side) of the display region 110A, there are provided a signal line driving circuit 120 and a scan line driving circuit 130 that are drivers for image display (peripheral circuits 12B to be hereinafter described).

Inside the display region 110A, a pixel driving circuit 140 is provided. FIG. 4 illustrates an example of the pixel driving circuit 140 (an example of pixel circuits of the red pixel 5R, the green pixel 5G, and the blue pixel 5B). The pixel driving circuit 140 is an active-type driving circuit that is provided in a lower layer of a pixel electrode 31 to be hereinafter described. The pixel driving circuit 140 includes a drive transistor Tr1, a write transistor Tr2, and a capacitor (a holding capacitor) Cs between the drive transistor Tr1 and the write transistor Tr2. Further, the pixel driving circuit 140 also includes a light-emitting element 10 that is coupled in series to the drive transistor Tr1 between a first power supply line (Vcc) and a second power supply line (GND). In other words, inside each of the red pixel 5R, the green pixel 5G, and the blue pixel 5B, there is provided the corresponding light-emitting element 10 (corresponding one of a red light-emitting element 10R, a green light-emitting element 10G, and a blue light-emitting element 10B, or a white light-emitting element 10W (not illustrated)). Each of the drive transistor Tr1 and the write transistor Tr2 is configured of a typical TFT, and a configuration thereof is not limited specifically. That is, the configuration thereof may be of an inversely-staggered structure (a so-called bottom-gate type) or may be of a staggered structure (a so-called top-gate type), for example.

In the pixel driving circuit 140, a plurality of signal lines 120A are disposed in a column direction, and a plurality of scan lines 130A are disposed in a row direction. A crossover point between each of the signal lines 120A and each of the scan lines 130A corresponds to any one of the red pixel 5R, the green pixel 5G, and the blue pixel 5B. Each of the signal lines 120A is coupled to the signal line driving circuit 120, and an image signal is supplied to a source electrode of the write transistor Tr2 via the signal line 120A from the signal line driving circuit 120. Each of the scan lines 130A is coupled to the scan line driving circuit 130, and scan signals are sequentially supplied to a gate electrode of the write transistor Tr2 via the scan line 130A from the scan line driving circuit 130.

In the display region 110A of the display unit 1A, as illustrated in FIG. 2, a semiconductor layer 20 and a display layer 30 are laminated in this order on the substrate 11. The semiconductor layer 20 has a multi-layered wiring pattern structure in which, in addition to a wiring pattern layer 25 that includes a wiring pattern layer 21 including a gate electrode 21A, a channel layer 23, and a pair of source-drain electrodes (a source electrode 25A and a drain electrode 25B), etc. or any other layer as a wiring pattern layer, a wiring pattern layer 27 is laminated on the wiring pattern layer 25 with an interlayer insulating film 26 made of an organic material interposed between.

Each of the transistors Tr1 and Tr2, the signal lines 120A, the scan lines 130A, and the power supply lines (Vcc and GND) in the display unit 1A may be configured of, for example, any of wiring patterns including the wiring pattern layers 21, 25, and 27, as well as the channel layer 23. FIG. 5 and FIG. 6 are each an example of a specific wiring layout of the transistors Tr1 and Tr2, the signal lines 120A, the scan lines 130A, and the power supply lines (Vcc and GND). In the present embodiment, for example, the scan line 130A and Vcc in FIG. 5 may correspond to the lower-layer wiring pattern 2 illustrated in FIG. 1, and the scan line 130A and Vcc are provided in the wiring pattern layer 25 in this example. Further, the signal line 120A and GND may correspond to the upper-layer wiring pattern 4 illustrated in FIG. 1, and the signal line 120A and GND are provided in the wiring pattern layer 27 in this example. It is to be noted that the plurality of upper-layer wiring patterns 4 that are provided on the organic insulating layer 3 may also preferably extend in one direction, for example, a Y-axis direction (a second direction) similarly to the lower-layer wiring patterns 2 for the reason to be hereinafter described.

Hereinafter, the description will be provided on the semiconductor layer 20 and the display layer 30.
(Configuration of Semiconductor Layer)

In the semiconductor layer 20 on the substrate 11, the drive transistor Tr1, the write transistor Tr2, and various wiring patterns as described above are provided, and a planarizing layer 28 is provided on those transistors Tr1 and Tr2, as well as the wiring patterns. Each of the transistors Tr1 and Tr2 (hereinafter referred to as a "thin-film transistor 20A") may be either of a top-gate type or a bottom-gate type; however, the description will be provided here taking the thin-film transistor 20A of the bottom-gate type as an example. In the thin-film transistor 20A, the gate electrode 21A, a gate insulating layer 22, an organic semiconductor film (channel layer 23) that forms a channel region, an interlayer insulating layer 24, and the pair of source-drain electrodes (a source electrode 25A and a drain electrode 25B) are provided in this order from the substrate 11 side, and the interlayer insulating film 26 and the wiring pattern layer 27 are further provided thereon.

As the substrate 11, in addition to a glass substrate, a plastic substrate made of a material such as polyether sulfone, polycarbonate, polyimides, polyamides, polyacetals, polyethylene terephthalate, polyethylene naphthalate, polyethyl ether ketone, and polyolefins; a metallic foil substrate whose surface is subjected to an insulating treatment and which is made of a material such as aluminum (Al), nickel (Ni), copper (Cu), and stainless steel; a paper substrate; etc. may be usable. Further, a functional film such as a buffer layer for improving the close-attachment properties or flatness, and a barrier film for improving the gas barrier performance may be provided on these substrates. Moreover, as long as it is possible to form the channel layer 23 as a film without heating the substrate 11 with use of a spattering technique or any other method, an inexpensive plastic film may be also usable for the substrate 11.

The gate electrode 21A has a role of applying a gate voltage to the thin-film transistor 20A to control the carrier density inside the channel layer 23 with use of such a gate voltage. The gate electrode 21A is provided at a selective region on the substrate 11, and may be configured of a simple metallic substance or alloy such as platinum (Pt), titanium (Ti), ruthenium (Ru), molybdenum (Mo), Cu, tungsten (W), Ni, Al, and tantalum (Ta). Alternatively, these materials may be used in a manner of laminating two or more of those materials.

The gate insulating layer 22 may be provided between the gate electrode 21A and the channel layer 23 with a thickness within the range of 50 nm to 1 μm, for example. The gate insulating layer 22 may include an insulating film containing one or more of materials such as silicon oxide (SiO), silicon nitride (SiN), silicon oxynitride (SiON), hafnium oxide (HfO), aluminum oxide (AlO), aluminum nitride (AlN), tantalum oxide (TaO), zirconium oxide (ZrO), hafnium oxynitride, hafnium silicon oxynitride, aluminum oxynitride, tantalum oxynitride, and zirconium oxynitride. The gate insulating layer 22 may be of a single-layer structure, or may be of a multi-layer structure using, for example, two or more materials such as an SiN film and an SiO film. When the gate insulating layer 22 has the multi-layer structure, it is possible to improve the characteristics of an interface with the channel layer 23, as well as to efficiently suppress ingress of impurities (for example, moisture) into the channel layer 23 from the outside air. The gate insulating layer 22 is patterned in a predetermined shape by etching after forming a film through a coating process; however, the patterning may be performed using a printing technique such as ink-jet printing, screen printing, offset printing, and gravure printing depending on an employed material.

The channel layer 23 is provided on the gate insulating layer 22 in an island shape, and has a channel region at a location facing the gate electrode 21A between the source electrode 25A and the drain electrode 25B. The channel layer 23 may have a thickness within the range of 5 nm to 100 nm, for example. The channel layer 23 may be configured of an organic semiconductor material such as a peri-Xanthenoxanthene (PXX) derivative. Examples of the organic semiconductor material may include polythiophene, poly-3-hexylthiophene (P3HT) that introduces hexyl groups into polythiophene, pentacene [2,3,6,7-dibenzoanthracene], polyanthracene, naphthacene, hexacene, heptacene, dibenzopentacene, tetrabenzopentacene, chrysene, perylene, coronene, terrylene, ovalene, quaterrylene, circumanthracene, benzopyrene, dibenzopyrene, triphenylene, polypyrrole, polyaniline, polyacetylene, polydiacetylene, polyphenylene, polyfuran, polyindole, polyvinyl carbazole, polyselenophene, polytellurophene, polyisothianaphthene, polycarbazole, polyphenylene sulfide, polyphenylene vinylene, polyphenylene sulfide, polyvinylene sulfide, polythienylene vinylene, polynaphthalene, polypyrene, polyazulene, phthalocyanine that is typified by copper phthalocyanine, merocyanine, hemicyanine, polyethylene dioxythiophene, pyridazine, naphthalene tetracarboxylic diimide, poly (3,4-ethylenedioxythiophene)/polystyrene sulfonate (PEDOT/PSS), 4,4'-biphenyldithiol (BPDT), 4,4'-diisocyanobiphenyl, 4,4'-diisocyano-p-terphenyl, 2,5-bis(5'-thioacetyl-2'-thiophenyl) thiophene, 2,5-bis(5'-thioacetoxyl-2'-thiophenyl) thiophene, 4,4'-diisocyanophenyl, benzidine (biphenyl-4,4'-diamine), TCNQ (tetracyanoquinodimethane), tetrathiafulvalene (TTF)-TCNQ complex, bisethylene tetrathiafulvalene (BEDTTTF)-perchloric acid complex, BEDTTTF-iodine complex, electric-charge-transfer complex that is typified by TCNQ-iodine complex, biphenyl-4,4'-dicarboxylic acid, 24-di (4-thiophenylacetylenyl)-2-ethylbenzene, 24-di (4-isocyanophenylacetylenyl)-2-ethylbenzene, dendrimer, fullerene such as C60, C70, C76, C78, and C84, 24-di(4-thiophenylethinyl)-2-ethylbenzene, 2,2"-dihydroxy-1,1':4',1"-terphenyl, 4,4'-biphenyldiethanal, 4,4'-biphenyldiol, 4,4'-biphenyldiisocyanate, 24-diacetynylbenzene, diethylbiphenyl-4,4'-dicarboxylate, benzo[22-c; 3,4-c'; 5,6-c"]tris[22]dithiol-24,7-trithion, alpha-sexithiophene, tetrathiotetracene, tetraselenotetracene, tetratellurtetracene, poly (3-alkylthiophene), poly (3-thiophene-β-ethane sulfonic acid), poly (N-alkylpyrrole) poly (3-alkylpyrrole), poly (3,4-dialkylpyrrole), poly(2,2'-thienylpyrrole), poly (dibenzothiophenesulfide), and quinacridone. Further, in addition to these materials, a compound selected from among groups including condensed polycyclic aromatic compounds, porphyrin-based derivatives, phenyl-vinylidene-based conjugated oligomers, and thiophene-based conjugated oligomers may be used alternatively. Moreover, organic semiconductor materials and polymer materials having the insulating property may be used in a mixed manner.

The channel layer 23 may be formed using a vacuum deposition method; however, the channel layer 23 may be preferably formed by use of a coating/printing process using, for example, ink solution in which the above-described material may be dissolved in organic solvent, for example. This is because the coating/printing process allows for further reduction in cost and is more effective in improving the throughput as compared with the vacuum deposition method. Specific examples of the coating/printing process may include methods such as cast coating, spin coating, spray coating, ink-jet printing, relief printing, flexographic printing, screen printing, gravure printing, and gravure offset printing.

The interlayer insulating layers 24 and 26 are intended to prevent short-circuiting between wiring patterns in different layers, for example, wiring patterns between the channel layer 23 and each of the source electrode 25A and the drain electrode 25B, between each of the source electrode 25A and the drain electrode 25B and the wiring pattern 27A, or the like. Examples of a constituent material for each of the interlayer insulating layers 24 and 26 may include a material having the insulating property; however, when the wiring pattern layers are configured in a multi-layered manner like the present embodiment, it may be preferable to use an insulating material having low dielectric constant to avoid signal delay. Specifically, examples of such a material may include a photosensitive resin material, and an organic insulating material such as polyimide-based organic insulating material, polyacrylate-based organic insulating material, epoxy-based organic insulating material, cresol novolac-based organic insulating material or polystyrene-based organic insulating material, polyamide-based organic insulating material and fluorine-based organic insulating material. It is to be noted that the material to be used for each of the interlayer insulating layers 24 and 26 is not limited to the organic insulating material, but, for example, the inorganic insulating material cited as a material for the above-described gate insulating layer 22 may be used alternatively.

The source electrode 25A and the drain electrode 25B are provided on the channel layer 23 away from each other, and are electrically coupled to the channel layer 23. As a constituent material for each of the source electrode 25A and the drain electrode 25B, a material such as a metallic material, a half-metallic material, and an inorganic semiconductor material is used. Specifically, other than the conductive film material cited as a material for the above-described gate electrode 21A, examples of the constituent material may include Al, gold (Au), silver (Ag), indium tin oxide (ITO), molybdenum oxide (MoO), or alloy of these metals. The source electrode 25A and the drain electrode 25B are each configured of a simple substance or alloy of any of the above-described metals, and such metal may be used in a single layer, or two or more kinds of such metal may be used in a laminated manner. Examples of a laminated structure may include Ti/Al/Ti and Mo/Al. Further, a configuration similar to the configuration of each of the source electrode 25A and the drain electrode 25B is applicable to the wiring pattern 27A as well.

The planarizing layer 28 is intended to planarize the surface of the substrate 11 on which the thin-film transistor 20A is formed. Examples of a constituent material for the planarizing layer 28 may include the above-described organic material including polyimide, and an inorganic material including SiO.

The configuration of the semiconductor layer 20 is described thus far with reference to the component parts of the thin-film transistor 20A; however, the wiring patterns that are formed in the same layers as various wiring patterns 21A, 25A, 25B, and 27A that configure the thin-film transistor 20A are provided using similar materials and similar processes irrespective of locations thereof.

(Configuration of Display Layer)

The display layer 30 includes the light-emitting element 10, and is provided on the semiconductor layer 20, more specifically, on the planarizing layer 28. The light-emitting element 10 is a light-emitting element in which a pixel electrode 31 acting as an anode, an interelectrode insulating film 32 (a dividing wall), an organic layer 33 including a light-emitting layer, and a counter electrode 34 acting as a cathode are laminated in this order from the semiconductor layer 20 side. On the counter electrode 34, a sealing substrate 36 is attached to a sealing layer 35 in between. The thin-film transistor 20A and the light-emitting element 10 are electrically coupled to the pixel electrode 31 via a coupling hole 28A that is provided in the planarizing layer 28.

The pixel electrode 31 has also a function of serving as a reflective layer, and it may be preferable in improving the light emission efficiency to have the highest possible reflectance. In particular, when the pixel electrode 31 is used as an anode, it may be preferable that the pixel electrode 31 be configured of a material having high hole-injecting characteristics. Examples of the foregoing pixel electrode 31 may include a simple substance or alloy of a metallic element such as Al, Cr, Au, Pt, Ni, Cu, W, or Ag. It may be desirable to laminate a transparent electrode having a large work function on the surface of the pixel electrode 31. In the present embodiment, the description is provided by taking as an example a case where the pixel electrode 31 has a laminated structure stacking a layer (a reflective electrode film 31A) that is formed of a material having the reflective function such as Al as described above and a layer (a transparent electrode film 31B) that is formed of a transparent conductive material such as ITO.

The dividing wall 32 is intended to assure the insulating property between the pixel electrode 31 and the counter electrode 34, as well as to form a light-emitting region in a desired shape, and may be made of photosensitive resin, for example. The dividing wall 32 is provided only at a surrounding area of the pixel electrode 31, and a region exposed from the dividing wall 32 on the pixel electrode 31 becomes the light-emitting region. It is to be noted that the organic layer 33 and the counter electrode 34 are provided also on the dividing wall 32; however, it is only the light-emitting region that causes light emission.

The organic layer 33 may have a configuration, for example, a hole injection layer, a hole transport layer, a light-emitting layer, an electron transport layer, and an electron injection layer are laminated in this order from the pixel electrode 31 side. These layers may be provided as appropriate. Each of the layers that configure the organic layer 33 may have a different configuration depending on, for example, light emission colors of the light-emitting elements 10R, 10G, and 10B. The hole injection layer improves the hole-injecting efficiency and serves as a buffer layer for preventing leakage. The hole transport layer improves the efficiency of transporting holes to the light-emitting layer. The light-emitting layer generates light in a manner of generating recombination of electrons and holes by applying an electrical field. The electron transport layer improves the efficiency of transporting electrons to the light-emitting layer. The electron injection layer improves the electron-injecting efficiency.

The counter electrode 34 may be made of alloy of a metallic material such as Al, magnesium (Mg), calcium (Ca), and sodium (Na). In particular, alloy of magnesium and silver (Mg—Ag alloy) may be preferable because it has both of the conductivity and less-absorption property in a thin film form. A ratio of magnesium to silver in the Mg—Ag alloy is not limited specifically; however, the ratio of magnesium to silver in film thickness may be preferably in the range from 20:1 to 1:1. Further, a material for the counter electrode 34 may be alloy of aluminum (Al) and lithium (Li) (Al—Li alloy) alternatively.

The sealing layer 35 may have a laminated structure that stacks, for example, a layer made of a material such as SiN, SiO, or metal oxide, and a layer made of a material such as thermosetting resin or ultraviolet curable resin. On the sealing layer 35, the sealing substrate 36 is attached that may be provided with, for example, a light-blocking film, color filters, or any other component part.

(1-2. Manufacturing Method)

It is possible to form the semiconductor layer 20 and the display layer 30 using a general method described below. First, a metallic film to be used as the gate electrode 21A is formed over a whole surface of the substrate 11 using a spattering method or a vacuum deposition method, for example. Next, the wiring pattern layer 21 is formed by patterning the formed metallic film using, for example, photolithography and etching techniques. Subsequently, the gate insulating layer 22 and the channel layer 23 are formed as films in this order over the whole surfaces of the substrate 11 and the gate electrode 21A. Specifically, the above-described gate insulating film material, for example, a PVP (Polyvinylpyrrolidone) solution is applied over the whole surface of the substrate 11 using, for example, a spin coat method, and then the surface coated with such a solution is dried. This process forms the gate insulating layer 22. Thereafter, an organic semiconductor material, for example, a PXX compound solution is applied onto the gate insulating layer 22. Afterward, by heating the applied organic semi-conductor material, the channel layer 23 is formed on the gate insulating layer 22.

Subsequently, the interlayer insulating layer 24 is formed on the channel layer 23, and thereafter a metallic film is formed on the channel layer 23 and the interlayer insulating layer 24. Specifically, a laminated film of, for example, Mo/Al/Mo may be formed using a spattering method, for example. Afterward, the wiring pattern layer 25 including the source electrode 25A, the drain electrode 25B, and the wiring pattern 25C is formed by means of etching with use of a photolithography method, for example.

Next, the interlayer insulating layer 26 is formed on the interlayer insulating layer 24 and the wiring pattern layer 25, and thereafter the wiring pattern layer 27 is formed on the wiring pattern layer 25 and the interlayer insulating layer 26 using a method similar to the above-described method. Subsequently, photosensitive resin such as polyimide is applied onto the interlayer insulating layer 26 and the wiring pattern layer 27. Thereafter, after the planarizing layer 28 is patterned in a predetermined shape through exposure and development, and the coupling hole 28A is formed therein, the planarizing layer 28 is subjected to a calcination treatment. Thereafter, a metallic film that may be made of a material such as Al/ITO is formed on the planarizing layer 28 using, for example, a spattering method, and thereafter the metallic film at predetermined locations is selectively removed using, for example, a wet etching method to form the pixel electrode 31 that is separated for each of the light-emitting elements 10R, 10G, and 10B.

Thereafter, the organic layer 33 including the light-emitting layer and the counter electrode 34 are formed as films using, for example, a vapor-deposition method. Thereafter, the sealing substrate 36 is attached thereto with the sealing layer 35 in between. Finally, mounting of an FPC intended for coupling with external circuits brings the display unit 1A to completion.

As seen in the display unit 1A illustrated in FIG. 2, in the wiring pattern layer that is configured in high density in such a manner that a plurality of wiring patterns are provided in a single layer, due to any defect in a film formation process of the wiring pattern layer, a short-circuit part X (a short-circuit part 25X in the present example) may be generated between the wiring patterns (for example, between a wiring pattern 25C1 and a wiring pattern 25C2 in the wiring pattern layer 25) as illustrated in FIG. 7, for example. The short-circuit part 25X may cause the wiring pattern 25C1 and the wiring pattern 25C2 to be electrically short-circuited, resulting in occurrence of circuit malfunction. Accordingly, it is desired to inspect the presence or absence of the short-circuit part 25X through a short-circuit defect inspection including an optical inspection, and to disconnect and remove the short-circuit part 25X that is detected by such an inspection, thereby repairing a circuit to a normal condition.

As described above, it is possible to disconnect and remove the short-circuit part X using a laser beam. However, detection of the short-circuit part X in a circuit having a multi-layer wiring structure is generally carried out in a state where a circuit including thin-film transistors and any other elements is brought to completion. For example, in the display unit 2 illustrated in FIG. 2, the presence or absence of a short-circuit defect (a short-circuit part X) is inspected at the stage (a stage where the wiring pattern layers to the extent of the wiring pattern layer 27 are formed) where all of the wiring pattern layers (the pixel driving circuit 140) including the thin-film transistor 20A that are formed inside the semiconductor layer 20 are disposed, and the detected short-circuit part X is disconnected and repaired. At this time, when the short-circuit part X is detected on a wiring pattern layer (for example, the wiring pattern layer 25) that is located at a lower layer than an interlayer insulating layer, the short-circuit part X is processed in a state of being covered with the interlayer insulating layer using the laser, for example.

Therefore, as with the case of the above-described PTL 2, a method of covering a wiring pattern layer with an organic insulating layer (organic resin) and disconnecting only the lower-layer wiring pattern layer without destroying the organic resin with use of a laser beam having the transparency with respect to the organic resin is considered; however, it has been difficult to achieve the desired insulating property. This may be because the metal dissolved by irradiation of the laser beam is not removed since a disconnection location is covered with the organic insulating layer.

On the other hand, when the lower-layer wiring pattern layer is disconnected together with the organic insulating layer using a laser beam with a wavelength having the great absorbability for the organic resin, the short-circuit part X is disconnected by use of the laser beam with a power output equal to or greater than a fixed power output. However, it is confirmed that a small amount of leakage current may be generated at a disconnection part thereof, and a display fault including a thin line defect may occur, or in a worse case, dielectric breakdown may arise during driving operation due to a shortage in a withstanding voltage or any other reason. This may be caused by attachment of soot dust arising from organic resin to be used as a constituent material for the organic insulating layer at the time of laser irradiation onto a bottom surface and side surfaces of a disconnection part A.

Accordingly, in the present embodiment, each of the plurality of lower-layer wiring patterns 2 (for example, a plurality of wiring patterns that are provided in the wiring pattern layer 25 in the display unit 1A illustrated in FIG. 2) that are covered with the organic insulating layer 3 is disposed to extend in the X-axis direction, for example. Specifically, as illustrated in an example in FIG. 5, the scan line 130A and Vcc that are provided in the wiring pattern layer 25 are disposed to run in parallel with each other in a single direction (an X-axis direction in this example). Further, the scan line 130A and Vcc are configured to be electrically coupled to each other partially. This makes it possible to perform an inspection (a short-circuit defect inspection) of the presence or absence of the short-circuit part X (the short-circuit part 25X) in the middle of formation of a pixel circuit (for example, at the stage where the wiring pattern layer 25 is formed), as well as to disconnect and repair the detected short-circuit part X (the short-circuit part 25X).

In other words, as illustrated in the flowchart illustrated in FIG. 8, after the lower-layer wiring pattern 2 (the wiring pattern layer 25) is formed (step S101), a short-circuit defect inspection of the lower-layer wiring pattern 2 (wiring pattern layer 25) (step S102) is performed, and when the short-circuit part X (the short-circuit part 25X) is detected, disconnecting and repair of the short-circuit part X (the short-circuit part 25X) are carried out (step S103). In the short-circuit defect inspection, the short-circuit part X (the short-circuit part 25X) may be detected and located by performing, for example, image matching (step S102-1) and electrical check (step S102-2). Specifically, the image matching performs a defect inspection and address extraction of a defect location, and the electrical check picks up a wiring pattern having the short-circuit part X to identify a location of the short-circuit part X. Subsequently, disconnecting and repair of the short-circuit part X are performed using, for example, laser irradiation or any other method. Thereafter, the organic insulating layer 3 is formed (step S104), and then the upper-layer wiring pattern 4 (the wiring pattern layer 27) is formed on the organic insulating layer 3 (the interlayer insulating film 26) (step S105). After the upper-layer wiring pattern 4 (the wiring pattern layer 27) is formed, detection of the short-circuit part X (the short-circuit part 27X (not illustrated)) in the upper-layer wiring pattern 4 (the wiring pattern layer 27) is carried out in a method similar to the method of the short-circuit defect inspection in the lower-layer wiring pattern 2, and thereafter disconnecting and repair of the short-circuit part X (the short-circuit part 27X) are carried out as appropriate.

As described above, in the present embodiment, it is possible to perform the short-circuit defect inspection in each of the wiring pattern layers (for example, the wiring pattern layer 25) as well as disconnecting and repair of the detected short-circuit part X in such a manner that the plurality of lower-layer wiring patterns 2 provided in a lower layer of the organic insulating layer 3 are electrically coupled to each other partially, and are disposed to run in parallel in a single direction. It is to be noted that the description is here provided with reference to the wiring pattern layer 25 that is provided in a lower layer of the interlayer insulating film 26; however, the same is applicable to a layer such as the wiring pattern layer 21 and the channel layer 23.

Further, for example, in the display unit 1A illustrated in FIG. 2, by making an electrical coupling (for example, a coupling part Y, see FIG. 2) between the wiring pattern layer 25 and, for example, the channel layer 23 that is formed in a lower layer thereof, the short-circuit defect inspection of the wiring pattern layer 25 makes it possible to detect the presence or absence of not only a short-circuit defect of the wiring pattern layer 25, but also a short-circuit defect of a layer such as the channel layer 23 that configures the thin-film transistor 20A or the wiring pattern layer 21 in which the gate electrode 21A and any other component parts are formed.

Moreover, by exercising ingenuity in a layout of a wiring pattern that is disposed in a layer different from the lower-layer wiring pattern 3 (a different-layer wiring pattern; for example, the upper-layer wiring pattern 4 (the wiring pattern layer 27 in FIG. 2), it is possible to further improve the manufacturing yield.

Specifically, as illustrated in FIG. 1, it may be preferable to design a layout (for example, see FIG. 5 and FIG. 6) in which the upper-layer wiring pattern 4 is orthogonal to the lower-layer wiring pattern 2. In disconnecting a location where wiring patterns are laminated with an interlayer insulating layer in between, it is likely that interlayer leakage occurs. In particular, as with the present embodiment, in a case where the interlayer insulating layer is formed of organic resin, the interlayer leakage may be more likely to be caused by attachment of soot dust arising from the organic resin at the time of laser irradiation onto surfaces to be irradiated with the laser as described above. Therefore, by designing a layout in which wiring patterns in the same layer run in parallel with each other, and wiring patterns in different layers run orthogonally to each other, a region is expanded that allows for disconnecting and repair of the short-circuit part X arising in a wiring pattern in each layer.

Further, it may be preferable that the upper-layer wiring pattern 4 (for example, the wiring pattern layer 27 in the display unit 1A) be a wiring pattern of a common potential (a common-potential line) such as a cathode. As a result, when the short-circuit part X is detected at a part of the upper-layer wiring pattern 4 (the wiring pattern layer 27), a pixel corresponding to the short-circuit part X is floated by disconnecting wiring patterns around the short-circuit part X, thereby making it possible to prevent occurrence of a line defect or a bright spot. As mentioned previously, the line defect or the bright spot is a critical fault that may significantly impair the visual quality of a display unit, and, for example, in the event of short-circuiting between the signal line 120A and the power supply line (GND), a line defect trouble may occur. As a specific method to remedy such a defect, conversion into a dark spot may be considered in such a manner that the short-circuit part X between the signal line 120A and GND is disconnected, or GND ahead or behind the short-circuit part X is disconnected to include such a disconnection location as a part of the signal line 120A along with the short-circuit part X, thereby putting the corresponding light-emitting element 10 in an electrically floating state. These disconnection locations are each an O-O line (a disconnection location A), a P-P line, and a Q-Q line (a disconnection location B) in FIG. 9.

Moreover, by designing a layout in which the upper-layer wiring pattern 4 (the wiring pattern layer 27) is configured as a common-potential line, and the upper-layer wiring pattern 4 (the wiring pattern layer 27) and the lower-layer wiring pattern 2 (the wiring pattern layer 25) are orthogonal to each other, while the lower-layer wiring pattern 2 (the wiring pattern layer 25) as well as the wiring pattern layer 21 and the channel layer 23 are not disposed underneath a disconnection part of the upper-layer wiring pattern 4 (the wiring pattern layer 27), it is possible to disconnect an R-R line and an S-S line, etc. in addition to the O-O line, P-P line, and Q-Q line as described above. That is, a region is expanded that allows for disconnecting and repair of the short-circuit part X arising in a wiring pattern in each layer over an almost whole region of the display region 110A (and the peripheral region 110B), which allows the manufacturing yield to be further improved.

(1-3. Working and Effects)

As described above, in the electronic device 1 (the display unit 1A) and the manufacturing method thereof in the present embodiment, the plurality of lower-layer wiring patterns 2 (for example, the wiring pattern layers 25 in the display unit 1A) that are covered with the organic insulating layer 3 (for example, the interlayer insulating film 26 in the display unit 1A) are electrically coupled to each other partially, and extend in parallel with each other in a single direction (for example, the X-axis direction). This makes it possible to perform a short-circuit defect inspection, as well as disconnecting and repair of the detected short-circuit part X at the stage where the lower-layer wiring pattern 2 is already formed. More specifically, prior to completion of a circuit including multi-layer wiring patterns, in other words, at the stage where formation of wiring patterns in each layer is completed, it is possible to detect the short-circuit part X, as well as to disconnect and repair the short-circuit part X.

As mentioned above, in the present embodiment, in the laminated wiring patterns (the lower-layer wiring pattern 2 and the upper-layer wiring pattern 4) with the organic insulating layer 3 interposed between, the plurality of lower-layer wiring patterns 2 that are provided in a lower layer of the organic insulating layer 3 are electrically coupled to each other partially, and extend in parallel with each other in a single direction in a layout design. This makes it possible to inspect the presence or absence of a short-circuit defect in the lower-layer wiring pattern 2, as well as to disconnect and repair the detected short-circuit part X at the stage where the lower-layer wiring pattern 2 is already disposed. More specifically, it is possible to carry out a short-circuit defect inspection of a circuit configured of multi-layer wiring patterns using organic resin as a material for the interlayer insulating film, as well as disconnecting and repair of a short-circuit defect easily and reliably for each of the wiring pattern layers. This makes it possible to provide the electronic device 1 achieving both of the quality and the manufacturing yield, and an electronic apparatus that includes the electronic device 1.

Hereinafter, the description will be provided on modification examples of the above-described embodiment. It is to be noted that any component parts same as those in the above-described embodiment are denoted with the same reference numerals, and the related descriptions are omitted.

2. APPLICATION EXAMPLES

The electronic device 1 (for example, the display unit 1A provided with a display device) that is described in the above-described embodiment may be preferably usable optimally as the following electronic apparatuses, for example.

Application Example 1

FIG. 10A illustrates an external appearance a tablet to which the display unit 1A according to the above-described embodiment is applied viewed from front side thereof, and FIG. 10B illustrates the external appearance of the tablet viewed from rear side thereof. This tablet may include, for example, a display section 610 (the display unit 1A) and a non-display section (a chassis) 620, as well as an operation section 630. The operation section 630 may be provided on the front surface of the non-display section 620 as illustrated in FIG. 10A, or may be provided on the top surface as illustrated in FIG. 10B.

Application Example 2

FIG. 11 illustrates an external appearance of a television apparatus to which the display unit 1A according to the above-described embodiment is applied. This television apparatus may have, for example, an image display screen section 200 including a front panel 210 and a filter glass 220, and the image display screen section 200 corresponds to the above-described display unit.

Application Example 3

FIG. 12 illustrates an external appearance of a laptop personal computer to which the display unit 1A according to the above-described embodiment is applied. This laptop personal computer may have, for example, a main unit 410, a keyboard 420 for operation of inputting characters or any other information, and a display section 430 that serves as the above-described display unit.

The disclosure is described thus far with reference to the embodiment and application examples thereof however, the disclosure is not limited to the above-described embodiment and the like, and various modifications may be made. For example, a material and a thickness of each layer, film-forming methods and film-forming requirements, disconnecting and repair of a short-circuit defect, or the like that are described in the above-described embodiment are not limited thereto, but any other materials and thicknesses may be used, or any other film-forming methods and film-forming requirements or disconnecting and repairing methods may be used alternatively. It is to be noted that the effects described in the present specification are provided only for illustrative purposes and non-limiting. Further, any other effect may be provided.

It is to be noted that the technology may be configured as follows.

(1) An electronic device including:

a plurality of first wiring patterns that are electrically coupled to each other partially, and each extend in a first direction;

an organic insulating layer provided on the first wiring patterns; and a second wiring pattern provided on the organic insulating layer.

(2) The electronic device according to (1), wherein the first wiring patterns are disposed in parallel with each other.

(3) The electronic device according to (1) or (2), wherein the second wiring pattern includes a plurality of second wiring patterns that each extend in a second direction.

(4) The electronic device according to (3), wherein the first direction and the second direction are orthogonal to each other.

(5) The electronic device according to any one of (1) to (4), further including a third wiring pattern that is provided in a lower layer of the first wiring patterns, and is electrically coupled to the first wiring patterns.

(6) The electronic device according to any one of (1) to (5), wherein the second wiring pattern is a common-potential wiring pattern.

(7) The electronic device according to any one of (5) to (7), wherein the third wiring pattern is one of a gate electrode and a pair of source and drain electrodes.

(8) A method of manufacturing an electronic device, the method including:

forming a plurality of first wiring patterns that are electrically coupled to each other partially, and each extend in a first direction;

forming an organic insulating layer on the first wiring patterns; and forming a second wiring pattern on the organic insulating layer.

(9) The method according to (8), further including, after the forming of the first wiring patterns, performing a short-circuit defect inspection of the first wiring patterns, and disconnecting and repairing a short-circuit part detected in the short-circuit defect inspection.

(10) An electronic apparatus with an electronic device, the electronic device including:

a plurality of first wiring patterns that are electrically coupled to each other partially, and each extend in a first direction;

an organic insulating layer provided on the first wiring patterns; and a second wiring pattern provided on the organic insulating layer.

This application claims the priority on the basis of Japanese Patent Application No. 2014-146855 filed on Jul. 17, 2014 in Japan Patent Office, the entire contents of which are incorporated in this application by reference.

Those skilled in the art could assume various modifications, combinations, subcombinations, and changes in accordance with design requirements and other contributing factors. However, it is understood that they are included within a scope of the attached claims or the equivalents thereof.

The invention claimed is:

1. A display device comprising:
a layer of first wires, each of the first wires extends along a first direction;
a layer of second wires, each of the second wires extends along a second direction; and
an interlayer between the layer of the first wires and the layer of the second wires,
wherein the interlayer is a resin, and
wherein one of the first wires cross many of the second wires.

2. The display device according to claim 1, wherein the first direction is perpendicular to the second direction.

3. The display device according to claim 1, wherein the first wires are between the interlayer and a layer of third wires.

4. The display device according to claim 3, wherein a first transistor comprises one of the third wires.

5. The display device according to claim 4, wherein the one of the third wires comprises a gate electrode of the first transistor.

6. The display device according to claim 4, wherein the one of the third wires comprises a source electrode of the first transistor.

7. The display device according to claim 4, wherein the one of the third wires comprises a drain electrode of the first transistor.

8. The display device according to claim 4, wherein one of the second wires is electrically connected to the first transistor.

9. The display device according to claim 8, wherein the one of the second wires is a signal line.

10. The display device according to claim 4, wherein one of the first wires is electrically connected to the first transistor.

11. The display device according to claim 4, wherein one of the first wires is electrically connected to a source-drain of the first transistor.

12. The display device according to claim 11, wherein the one of the first wires is a power supply line.

13. The display device according to claim 11, further comprising:
a light-emitting element electrically connected to another source-drain of the first transistor.

14. The display device according to claim 13, wherein the another of the first wires is electrically connected to a second transistor.

15. The display device according to claim 14, wherein the another of the first wires is electrically connected to a gate electrode of the second transistor.

16. The display device according to claim 14, wherein the another of the first wires is a scan line.

17. The display device according to claim 1, wherein the interlayer touches the layer of the first wires.

18. The display device according to claim 1, wherein the interlayer touches the layer of the second wires.

19. The display device according to claim 1, wherein one of the first wires cross one of the second wires.

* * * * *